United States Patent
Hsu et al.

(10) Patent No.: US 7,522,076 B1
(45) Date of Patent: Apr. 21, 2009

(54) PARALLEL CONTEXT ADAPTIVE BINARY ARITHMETIC CODING

(75) Inventors: Pei-Wei Hsu, Taipei (TW); Chih-Hui Kuo, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/873,406

(22) Filed: Oct. 16, 2007

(51) Int. Cl.
*H03M 7/00* (2006.01)
(52) U.S. Cl. .............................. 341/107; 341/50; 341/51
(58) Field of Classification Search ................. 341/107, 341/50, 51
See application file for complete search history.

(56) References Cited

U.S. PATENT DOCUMENTS

| | | | |
|---|---|---|---|
| 6,240,214 B1 * | 5/2001 | Cho | 382/247 |
| 6,263,024 B1 * | 7/2001 | Matsumoto | 375/240.16 |
| 6,411,231 B1 * | 6/2002 | Yanagiya et al. | 341/107 |
| 7,079,057 B2 * | 7/2006 | Kim et al. | 341/107 |
| 7,292,731 B2 * | 11/2007 | Sekiguchi et al. | 382/238 |
| 7,336,720 B2 * | 2/2008 | Martemyanov et al. | 375/240.12 |
| 2002/0021234 A1 * | 2/2002 | Yanagiya et al. | 341/107 |
| 2006/0028359 A1 * | 2/2006 | Kim et al. | 341/50 |
| 2006/0158355 A1 * | 7/2006 | Jeon et al. | 341/50 |

OTHER PUBLICATIONS

Wei Yu; Yun He, IEEE Transaction on Consumer Electronics, vol. 51, No. 4, Nov. 2005.

* cited by examiner

*Primary Examiner*—Jean B Jeanglaude
(74) *Attorney, Agent, or Firm*—Winston Hsu

(57) ABSTRACT

A method for performing parallel processing of at least two bins in an arithmetic coded bin stream includes: utilizing a current range to calculate a range for a first bin in the bin stream; simultaneously utilizing the current range to forward predict a plurality of possible ranges and low values for a second bin in the bin stream when the first bin is an MPS; when the range for the first bin is calculated, utilizing the calculated range to select a resultant range from the plurality of possible ranges and low values for the second bin.

17 Claims, 2 Drawing Sheets

PARALLEL CONTEXT ADAPTIVE BINARY ARITHMETIC CODING

BACKGROUND

The present invention relates to statistical data compression, and more particularly to binary arithmetic coding.

Data compression works by encoding data according to a certain format to reduce the amount of data that needs to be transmitted in a system. A decoder can then decode the encoded data utilizing the same format to convert the data back to their original state. Many examples of data compression exist, although developments and improvements to conventional techniques are constantly being made.

Arithmetic coding is a form of data compression that takes a plurality of symbols, processes them, and writes the codes to a file. Arithmetic coding utilizes probability estimation in order to code symbols, by assigning each symbol an interval of a range, wherein the range parameters are 0 and 1. In probability estimation, a symbol that has greater probability of appearing is assigned a greater part of the range, and a symbol that has less probability of appearing is assigned the smaller part of the range. This probability estimation will be described in more detail in the following.

For example, when coding a bin string "010", a probability of symbol "1" is 0.4, and a probability of "0" is 0.6. Therefore, "0" is the most probable symbol (MPS) and "1" is the least probable symbol (LPS) in this example. Initially, a range is 200, and a low value is 0. When the first symbol "0" is coded, as the probability of "0" is 0.6, the range will be 0.6 of 200, or 120. Because the MPS occupies the lower part of the range, the low value will remain as 0. For the next symbol, the probability of "1" is 0.4, so the range now becomes 0.4 of 120, or 48. As the LPS occupies the upper part of the range, the new low value is 72. Finally, for the symbol "0", the new range becomes 0.6 of 48, or 28.8, and the low value will remain the same.

Binary arithmetic coding is a form of arithmetic coding that converts all symbols into binary form before processing. The binary arithmetic coding process occurs in four stages. The first stage is the binarization stage, where each symbol is converted into a binary value (bin), thereby forming a bin stream. In the second stage, a context model (probability model) is chosen, based on previously coded bins. In the third stage, each bin is coded according to a current context model, and in the fourth stage the context model is updated according to the coded bin. In binary arithmetic coding, the range value is a 9-bit value, wherein bit 9 is the most significant bit (MSB), and shows whether the range has fallen below 256 or not.

Context Adaptive Binary Arithmetic Coding (CABAC) is a well-known form of arithmetic coding, that updates the probability each time a bin is coded, according to previously coded bins. CABAC utilizes LPS look-up tables (LUTs), containing a plurality of possible range values. A current context model and bits 7 and 8 of a current range are input to the LPS LUT and a predicted range value according to this information is output.

Please refer to FIG. 1. FIG. 1 is a diagram of a bin coding engine 100. The bin coding engine 100 comprises an LPS coding table 120, a subtracter 130, and an adder 140. Initially, a previous range and a context model are input to the LPS coding table 120, which outputs a first LPS range according to this information. The bin coding engine 100 also determines a first MPS range by subtracting the first LPS range from the previous range using the subtracter 130. Additionally, a previous low value of the previous range is input to the bin coding engine 100. If the current bin is an MPS, the low value will remain the same (please see the example in the above paragraph), so this value can be directly output. If the current bin is an LPS, however, the low value must be added to the first MPS range output from the subtracter 130. This operation is performed by the adder 140.

As can be seen from the above description, the coding operation for each bin is complicated. In the conventional art, as each bin must be coded sequentially, the throughput is limited.

SUMMARY

With this in mind, the present invention aims to provide a system and method for increasing the throughput of arithmetic coding engines.

An arithmetic coding system for coding at least two bins in a bin stream in parallel according to an exemplary embodiment of the present invention is disclosed. The system comprises: a first bin coding engine, for receiving a current range and utilizing said current range to calculate a range for a first bin in the bin stream; and a second bin coding engine, coupled in parallel to the first bin coding engine, for simultaneously utilizing the current range to forward predict a plurality of possible ranges for a second bin in the bin stream when the first bin is an MPS, and utilizing the calculated range for the first bin to select a resultant range and low for the second bin.

A method for performing parallel processing of at least two bins in an arithmetic coded bin stream is also disclosed. The method comprises: utilizing a current range to calculate a range for a first bin in the bin stream; simultaneously utilizing the current range to forward predict a plurality of possible ranges and low values for a second bin in the bin stream when the first bin is an MPS; and when the range for the first bin is calculated, utilizing the calculated range to select a resultant range from the plurality of possible ranges and low values for the second bin.

These and other objectives of the present invention will no doubt become obvious to those of ordinary skill in the art after reading the following detailed description of the preferred embodiment that is illustrated in the various figures and drawings.

DETAILED DESCRIPTION

As detailed above, the present invention aims to increase the throughput of a bin coding engine by processing separate bins in parallel. The present invention achieves this by utilizing forward prediction to determine a plurality of possible range values and low values for a second bin when a first bin is an MPS, then utilizing the determined range value of the first bin to select a resultant range value and low value for the second bin. When the first bin is an LPS the parallel determination can be performed directly.

Please refer to FIG. 1 again. As can be seen from the diagram, the bin coding engine 100 inputs a current range and a context model (probability) to the LPS coding table 120 and generates two possible ranges of a first bin, an LPS range and an MPS range. If the first bin is an LPS then the first range will be selected, whereas if the first bin is an MPS then the second range will be selected. Therefore, a second bin coding engine has two possible input ranges. Furthermore, each bin has an associated context model (probability), because the context model is updated according to whether a first bin is an MPS or an LPS.

If the first bin is an LPS then the range and low value can be calculated directly because only one possible value will exist. If, however, the first bin is an MPS then the bin coding engines will have to utilize forward prediction to determine possible ranges and low values for a second bin coding engine.

Case 1: First Bin is an MPS

As mentioned above, bits 7 and 8 of the range are utilized as a key to access the LPS coding table 120 for outputting an LPS range for a next bin in the bin stream. When the first bin is an MPS, as the range output from the first bin coding engine 100 is not yet known, bits 7 and 8 could be four possible values, namely: {0,0}, {0,1}, {1,0} or {1,1}. Each of these bit combinations will give rise to two possible ranges depending on whether the range requires renormalization, as the range used for the second bin will have been updated accordingly if it needs to be renormalized. Therefore, there are 8 possible outcomes for the range of the second bin. Similarly, there are 8 possible outcomes for the low value of the second bin corresponding to the 8 possible ranges of the second bin. One of the ranges and one of the low values of the second bin can be selected and ready for the next bin in the bin stream once the range of the first bin is determined. By generating all these outcomes for the second bin in parallel with the range generation of the first bin coding engine 100, the throughput can be increased considerably.

Figure 1:
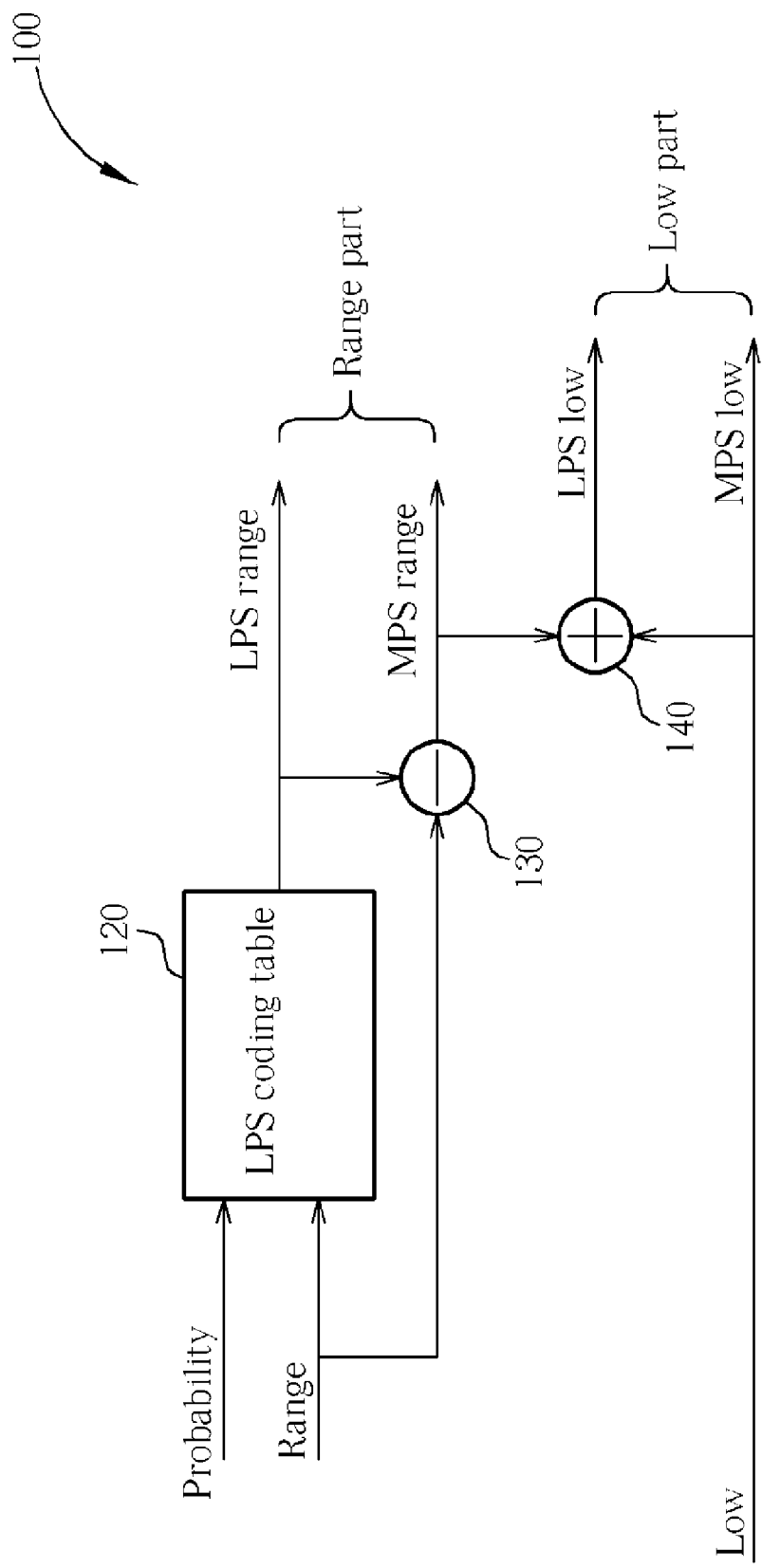
FIG. 1 is a diagram of a bin coding engine according to the related art.
Figure 2:
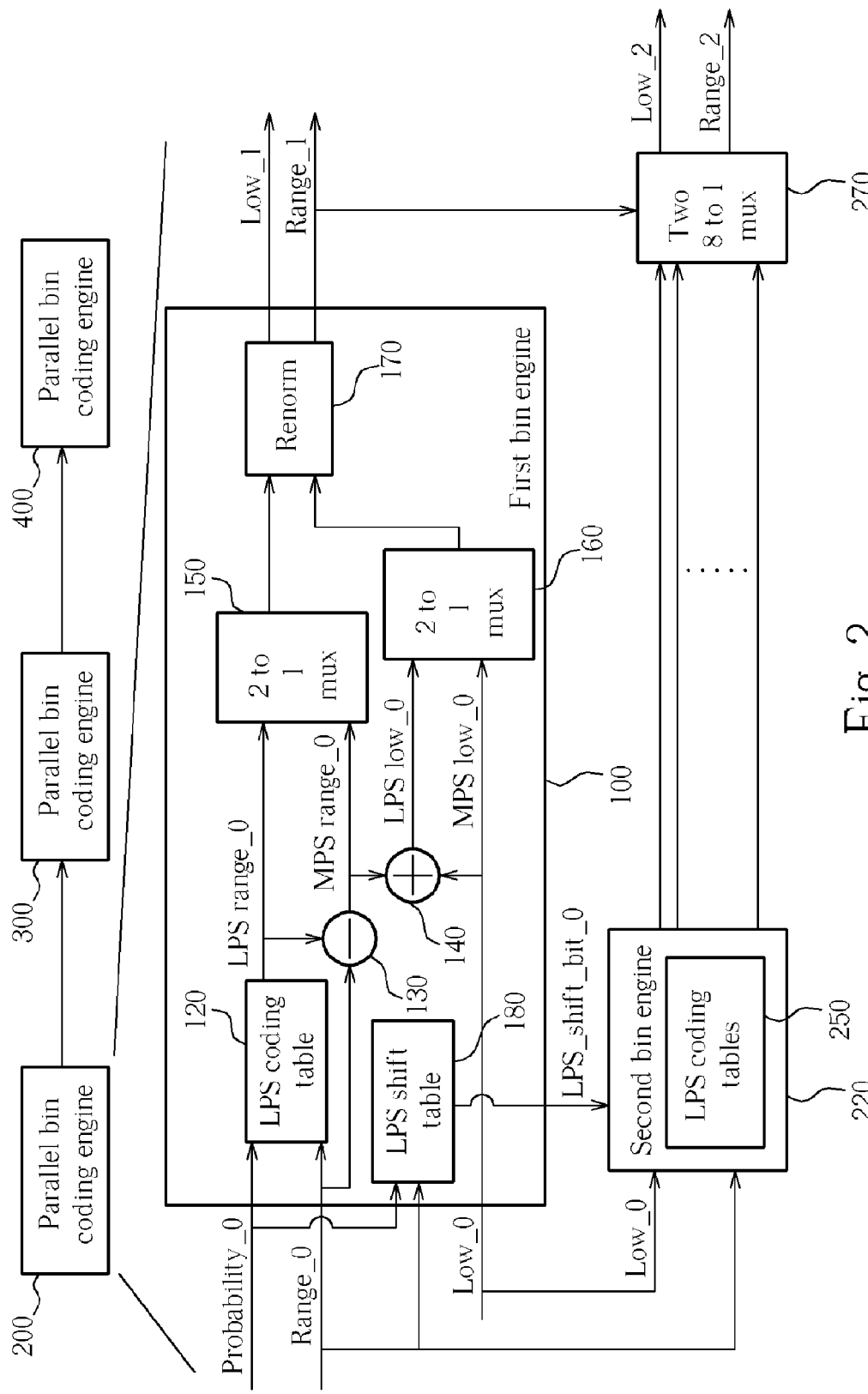
FIG. 2 is a diagram of a parallel coding system according to an exemplary embodiment of the present invention.

Please refer to FIG. 2. FIG. 2 is a diagram of a parallel bin coding system according to an exemplary embodiment of the present invention. The parallel bin coding system comprises a plurality of parallel bin coding engines 200, 300, and 400. For simplicity of illustration, only parallel bin coding engine 200 is shown in detail. The parallel bin coding engine 200 comprises a first bin coding engine 100, and at least a second bin coding engine 220 comprising an LPS coding table 250, and two 8 to 1 multiplexers (mux) 270 for choosing a final low value and a final range for the second bin from the eight possible results when the first bin is an MPS. Please note that, although parallel bin coding engine 200 is shown as comprising a first bin coding engine 100 and a second bin coding engine 220 only, this is not a limitation of the present invention, and it will be appreciated by one skilled in the art that parallel bin coding engine 200 could comprise three or more bin coding engines without departing from the spirit of the present invention. Please also note that components of the first bin coding engine 100 having the same numerals as those shown in FIG. 1 also have the same function, and therefore further detail is omitted for brevity.

When the current range and low value are received by the first bin coding engine 100 they are also simultaneously received by the second bin coding engine 220. In this embodiment, as the first bin is an MPS then eight possible values for the range and the low value must be calculated for the second bin. The eight possible values depend on bits 7 and 8 of the resultant range of the first bin, and also depend on whether the first bin is renormalized or not.

The 2 to 1 multiplexers 150 and 160 of the first bin coding engine 100 select an intermediate range and intermediate low value, and a renormalization block 170 selectively performs renormalization to the intermediate range and low value to generate the range and low value for the next bin. The renormalization block 170 expands the range to fully use its bit length if the most significant bit (MSB) of the range is 0. An exemplary method of expanding the range when the first bin is an MPS is to left shift the value of the range by 1 bit. When the range and low value of the first bin (Range_1 and Low_1) are received by the second bin coding engine 220, the Range_1 and Low_1 are shifted 6 bits to obtain bits 7 and 8 respectively. As it is also known whether Range_1 and Low_1 have been renormalized or not, the range and low value of the second bin (Range_2 and Low_2) can be correctly selected from the eight generated values. This operation is performed by the two 8 to 1 multiplexers 270, wherein the first 8 to 1 multiplexer selects the resultant range and the second 8 to 1 multiplexer selects the resultant low value from the eight generated values.

If the MSB of a nine-bit range is not a '1', this indicates that the range has fallen below 256 and therefore needs to be renormalized before more coding can be carried out. This is achieved by left shifting the range by one bit for an MPS, and by as much as 7 bits for an LPS. This can be performed before the operation of the two 8 to 1 multiplexers 270, i.e. all eight possible range values will be renormalized, or after the result of the first bin coding engine 100 is received. Both operations fall within the scope of the present invention.

Case 2: First Bin is an LPS

Please refer to FIG. 1 and FIG. 2 together. As can be seen by comparing the two diagrams, the first bin coding engine 100 in FIG. 2 also comprises an LPS shift table 180, two 2 to 1 multiplexers 150, 160, and a renormalization circuit 170. The LPS shift table 180 is utilized for determining how many bits the range needs to be shifted by during renormalizing, when the first bin is an LPS. The two 2 to 1 multiplexers 150, 160 output a range and a low value respectively for the first bin depending on whether the first bin is an LPS or an MPS. Because this result is not known at the time of calculating the range and low value for the second bin, the determined number of shift bits is input to the second bin coding engine 220, as well as the context model, the range Range_0 and the low value Low_0.

The second bin coding engine 220 utilizes the input number of shift bits to accurately determine the low value and range for the second bin when the first bin is an LPS. As in the first bin coding engine 100, two possible ranges and two possible low values are generated, and then a resultant low value and range are selected, according to whether the second bin is an LPS or an MPS.

Putting the two cases together, the second bin coding engine 220 will therefore forward predict eight possible values for the case where the first bin is an MPS, and also calculate two low values and two ranges for the case where the first bin is an LPS. (The two low values and two ranges correspond to the second bin being an LPS or an MPS.) Once the determination of the first bin is known, the second bin coding engine 220 can select from all predicted values to output a low value and a range for the second bin. These values can then be simultaneously input to a third bin coding engine and a fourth bin coding engine, and the operation will proceed as above.

It will be clear to those skilled in the art that it is possible to code more than two bins in parallel by implementing a bin coding engine that forward predicts possible ranges and low values for a third bin, etc. then utilizes the calculated range of the previous bin for selecting a resultant range and low value. This also falls within the scope of the present invention.

By forward predicting possible ranges for a second bin at the same time as calculating a range for a first bin in a bin stream when the first bin is an MPS, the throughput of an arithmetic coding system can be improved. When the first bin is an LPS, calculation of a low value and range for the second bin can be performed directly. By simultaneously forward predicting possible ranges for many bins in a bin stream the throughput of coding engines can be improved significantly. In one cycle a considerable number of bins can be coded. Therefore, the efficiency of the parallel bin coding system of the present invention has many advantages over the prior art.

Those skilled in the art will readily observe that numerous modifications and alterations of the device and method may be made while retaining the teachings of the invention.

What is claimed is:

1. A method for performing parallel processing of at least two bins in an arithmetic coded bin stream, the method comprising:
   utilizing a current range to calculate a range for a first bin in the bin stream;
   when the first bin is an MPS, simultaneously utilizing the current range to forward predict a plurality of possible ranges and low values for a second bin in the bin stream;
   when the range for the first bin is calculated, utilizing the calculated range to select a resultant range from the plurality of possible ranges and low values for the second bin.

2. The method of claim 1, wherein the step of utilizing the calculated range of the first bin to select a resultant range from the plurality of possible ranges for the second bin further comprises:
   utilizing a value of a most significant bit (MSB) of the resultant range to selectively renormalize the resultant range for the second bin.

3. The method of claim 1, wherein the step of simultaneously utilizing the current range to forward predict a plurality of possible ranges for the second bin in the bin stream further comprises:
   utilizing a value of a most significant bit (MSB) of each of the plurality of possible ranges to selectively renormalize each respective possible range.

4. The method of claim 1, wherein the arithmetic coding is utilized in an H.264 system.

5. The method of claim 1, wherein the step of utilizing a current range to calculate a range for a first bin in the bin stream further comprises:
   utilizing a current low value and current range to calculate a low value for the first bin; and
   the step of simultaneously utilizing the current range to forward predict a plurality of possible ranges and low values for a second bin in the bin stream further comprises:
   simultaneously utilizing the current low value and current range to forward predict a plurality of possible low values for the second bin.

6. The method of claim 1, wherein the range for the first bin is renormalized if a most significant bit of the range is 0.

7. The method of claim 1, wherein when the first bin is an LPS a range and low value for the second bin can be calculated directly.

8. The method of claim 7, wherein when the first bin is an LPS the method further comprises:
   determining a number of shift bits required for renormalizing a range for the first bin; and
   utilizing the determined number of shift bits to determine the range and low value for the second bin.

9. An arithmetic coding system for coding at least two bins in a bin stream in parallel, the arithmetic coding system comprising:
   a first bin coding engine, for receiving a current range and utilizing said current range to calculate a range for a first bin in the bin stream; and
   a second bin coding engine, coupled in parallel to the first bin coding engine, for simultaneously utilizing the current range to forward predict a plurality of possible ranges for a second bin in the bin stream when the first bin is an MPS, and utilizing the calculated range for the first bin to select a resultant range and low for the second bin.

10. The system of claim 9, wherein the second bin coding engine comprises:
    a coding table for receiving the current range and utilizing said current range to forward predict each of the plurality of possible ranges for the second bin of the bin stream; and the system further comprises:
    a first 8 to 1 multiplexer, coupled to the first bin coding engine and the second bin coding engine, for receiving the plurality of possible ranges from the second bin coding engine and the calculated range for the first bin from the first bin coding engine, and utilizing the calculated range for the first bin to select the resultant range and low for the second bin.

11. The system of claim 10, wherein the plurality of possible ranges are selectively renormalized before being input to the 8 to 1 multiplexer.

12. The system of claim 10, wherein the first bin coding engine receives a current low value and utilizes said current range and low value to calculate a low value for the first bin; and the second bin coding engine simultaneously utilizes the current range and low value to forward predict a plurality of possible low values for the second bin when the first bin is an MPS, and utilizes the calculated range value for the first bin to select a resultant low value for the second bin.

13. The system of claim 12, wherein the second bin further comprises:
    a second 8 to 1 multiplexer, coupled to the first bin coding engine and the second bin coding engine, for receiving the plurality of possible low values from the second bin coding engine and the calculated low value for the first bin from the first bin coding engine, and utilizing the calculated range value for the first bin to select the resultant low value for the second bin.

14. The system of claim 9 being utilized in an H.264 system.

15. The system of claim 9, wherein the first bin coding engine further comprises a renormalization block, for selectively renormalizing the range for the first bin based on a most significant bit of the range.

16. The system of claim 9, wherein when the first bin is an LPS the second bin coding engine calculates a range and low value for the second bin directly.

17. The system of claim 16, wherein the first bin coding engine further comprises an LPS shift table, for determining a number of shift bits required for renormalizing a range for the first bin, and inputting the determined number of shift bits to the second bin coding engine.

* * * * *